(12) United States Patent
Kasukawa et al.

(10) Patent No.: US 7,045,075 B2
(45) Date of Patent: May 16, 2006

(54) CERAMIC MATERIAL AND PIEZOELECTRIC ELEMENT USING THE SAME

(75) Inventors: Kazuhisa Kasukawa, Saitama (JP); Kazutoshi Ohno, Saitama (JP)

(73) Assignee: Bosch Automotive Systems Corporation, Tokyo (JP)

( * ) Notice: Subject to any disclaimer, the term of this patent is extended or adjusted under 35 U.S.C. 154(b) by 0 days.

(21) Appl. No.: 10/451,151

(22) PCT Filed: Dec. 27, 2001

(86) PCT No.: PCT/JP01/11577

§ 371 (c)(1),
(2), (4) Date: Dec. 2, 2003

(87) PCT Pub. No.: WO02/053514

PCT Pub. Date: Jul. 11, 2002

(65) Prior Publication Data

US 2004/0072670 A1 Apr. 15, 2004

(30) Foreign Application Priority Data

Dec. 28, 2000 (JP) .............................. 2000-402891

(51) Int. Cl.
*H01L 41/18* (2006.01)
*C04B 35/49* (2006.01)

(52) U.S. Cl. .............................. 252/62.9 PZ; 501/134; 501/135; 501/136; 310/311; 310/364; 310/663

(58) Field of Classification Search ................ 501/134, 501/135, 136; 252/62.9 PZ; 310/311, 364, 310/663

See application file for complete search history.

(56) References Cited

U.S. PATENT DOCUMENTS

| | | | |
|---|---|---|---|
| 3,956,150 A | 5/1976 | Ouchi et al. | |
| 5,500,142 A | 3/1996 | Ushida et al. | |
| 5,753,136 A | 5/1998 | Tani et al. | |
| 6,080,328 A | 6/2000 | Horikawa | |
| 6,104,128 A | 8/2000 | Fujii et al. | |
| 6,299,791 B1 * | 10/2001 | Yoshizawa et al. | ... 252/62.9 PZ |

FOREIGN PATENT DOCUMENTS

| | | | |
|---|---|---|---|
| JP | 62-197351 | * | 9/1987 |
| JP | 64-089485 | | 4/1989 |
| JP | 03-215359 | | 9/1991 |
| JP | 6-24841 | | 2/1994 |
| JP | 6-191941 | | 7/1994 |
| JP | 07-041363 | | 2/1995 |
| JP | 7-315924 | | 12/1995 |
| JP | 8-239268 | | 9/1996 |
| JP | 09-110525 | | 4/1997 |
| JP | 10-330163 | | 12/1998 |
| JP | 10-338572 | | 12/1998 |

* cited by examiner

Primary Examiner—C. Melissa Koslow
(74) Attorney, Agent, or Firm—Jacobson Holman PLLC

(57) ABSTRACT

A ceramic material has piezoelectric characteristics, can be sintered at low temperature, and is suited to various piezoelectric devices. The ceramic material primarily includes Pb, Zr, and Ti and has the general formula $ABO_d$, in which A is $(Pb_{1-a}M^1{}_{a-b})$, where $M^1$ is selected from the group consisting of group 3A elements, Li, Na, K, Mg, Ca, and Sr, and B is $[(M^2{}_{1/3}Nb_{2/3-c})_\alpha Zr_\beta Ti_\gamma]$, where $M^2$ is one or more elements capable of forming at least a perovskite structure in the ceramic material, or the formula $Pb_x M^3{}_{1-x}[(M^4{}_{1/3}Nb_{2/3})_e (Co_{1/3}Nb_{2/3})_f (Zn_{1/3}Nb_{2/3})_g Zr_h Ti_i]O_3$, where $M^3$ denotes one or more elements selected from among the group consisting of La, K, Er, and Yb and $M^4$ denotes an element selected from among the group consisting of Ni, Mn, and Sr. The ceramic material can be prepared by sintering at a temperature of 950° C. or less and has good piezoelectric characteristics, in particular good longitudinal elongation ($d_{33}$) and a low dielectric loss factor (tan δ), even at a high Curie temperature (Tc), as well as a good electromechanical coupling factor (Kp).

46 Claims, No Drawings

CERAMIC MATERIAL AND PIEZOELECTRIC ELEMENT USING THE SAME

TECHNICAL FIELD

The present invention relates to a ceramic material having piezoelectric characteristics that can be sintered at low temperature and is suited to various piezoelectric devices such as piezoelectric actuators. The present invention further relates to piezoelectric elements and laminated piezoelectric elements comprising a member comprised of a ceramic material that can be sintered at low temperature and has piezoelectric characteristics and electrodes.

BACKGROUND ART

In recent years, laminated piezoelectric ceramics in which a piezoelectric ceramic and a metal constituting an internal or external electrode are laminated have begun to be employed as piezoelectric actuators and piezoelectric transducers for controlling spraying of color ink in ink-jet printers and controlling the spraying of common rail fuels in diesel engines. In such piezoelectric ceramics, PZT materials comprised primarily of composite oxides of lead, zirconium, and titanium are employed to achieve high elongation ($d_{33}$) with the application of voltage.

Examples of products employing these PZT materials are piezoelectric actuators, piezoelectric vibrators in the form of computer oscillators, ceramic filters, piezoelectric transducers, the ignition elements of gas instruments, piezoelectric buzzers, ultrasonic transceivers, microphones, and ultrasonic humidifiers. Among these, piezoelectric actuators, which are solid-state elements employing voltage effects, consume less power, respond more rapidly, and permit finer positional control than conventional electromagnetic actuators configured of a coil wound around a magnetic member. They also have the advantages of generating little heat and being small in size and weight.

The piezoelectric material employed in piezoelectric actuators must afford high voltage characteristics with regard to change in temperature, durability, and the like. Further, various laminated piezoelectric actuator applications of laminated ceramic capacitor technology have recently been developed as small actuators yielding high strain at relatively low applied voltages. High voltage characteristics are naturally also demanded of these laminated piezoelectric actuators.

The above-mentioned actuators require the application of a relatively high voltage. Thus, good conductors such as silver-palladium alloy (Ag—Pd alloy) that generate little heat are widely employed as the electrodes in piezoelectric elements. The piezoelectric elements for these laminated piezoelectric actuators are generally manufactured by coating an internal electrode-forming conductive paste on a ceramic green sheet of piezoelectric material, laminating multiple layers, and conducting simultaneous sintering. That is, in the manufacturing of a laminated piezoelectric actuator, since the internal electrode and the piezoelectric material are sintered simultaneously, a material capable of being sintered at low-temperature must be employed so that the internal electrode does not melt at the sintering temperature.

To adequately sinter the laminated piezoelectric ceramic employing the above-described PZT ceramic, sintering must be conducted at a temperature of greater than or equal to 1,100° C. in an oxidizing atmosphere comprising oxygen or the like. In the conventional method of manufacturing laminated piezoelectric ceramics, a paste primarily comprising a metal is coated on a green sheet or sheet-like formed member of PZT ceramic powder to form a conductive layer, these are laminated, the binder is removed, and sintering is conducted at high temperature. That is, the mainstream method is that of forming an integrated member by simultaneous sintering. Thus, the metal employed in lamination is limited to a noble metal comprising platinum group, such as a silver-palladium alloy, that does not melt in high-temperature oxidizing environments and has a melting point of greater than or equal to 1,100° C.

Generally, the melting point of this silver palladium alloy increases with the palladium content in the alloy. Further, since silver diffuses into the piezoelectric material in high temperature sintering, the durability as an actuator drops precipitously. Since palladium is expensive, it is desirable to reduce to the extent possible the quantity of palladium blended into the alloy to lower the cost of the product.

From these perspectives, silver-palladium alloys incorporating comparatively little palladium have been developed. The Ag70-Pd30 alloy, which is relatively good from both the perspective of heat resistance and cost, is widely employed as an electrode material in piezoelectric elements. Ag70-Pd30 alloy comprises about 30 weight percent (25 to 35 weight percent) palladium and can prevent melting at temperatures below 1,150° C. Piezoelectric elements produced by simultaneously sintering Ag70-Pd30 alloy and a piezoelectric material at 1,150° C. have been reported. However, the piezoelectric characteristics of the piezoelectric elements obtained have not been satisfactory.

Accordingly, attempts have been made to improve piezoelectric characteristics by employing a piezoelectric material that will sinter with silver palladium at temperatures below 1,150° C. An example of such a materials is the PZT piezoelectric material denoted by $Pb[(Zn_{1/3}Nb_{2/3})(Ni_{1/3}Nb_{2/3}),Zr,Ti]O_3$, which can be employed in laminated piezoelectric actuators employing an Ag70-Pd30 internal electrode. Even when simultaneously sintered with an internal electrode at a temperature (such as 1,120° C.) lower than 1,150° C., this piezoelectric material exhibits some level of piezoelectric characteristics.

However, the piezoelectric characteristics that are achieved, particularly the electromechanical coupling factor (Kp), are still inadequate. Further, a reduction in the amount of palladium blended into the silver-palladium alloy is desired in addition to a reduction in the sintering temperature. However, as of today, no piezoelectric material that can be sintered at a temperature of less than or equal to 1,120° C. and yields good piezoelectric characteristics has been reported.

Nor is any piezoelectric material known in which, even at a high Curie temperature Tc, the elongation during voltage application, particularly the piezoelectric strain constant $d_{33}$ in the longitudinal direction, is higher than the previous level, while also exhibiting a low dielectric loss factor tan δ.

Thus, the present invention, devised to solve the above-stated problems, has for its object to provide a ceramic material that can be prepared by simultaneous sintering with not only a silver-palladium alloy such as Ag70-Pd30Ag—Pd but also alloys having a lower palladium blend proportion and other metals having low melting points as an electrode—that is, by sintering at a temperature of 950° C. or below—and that has good piezoelectric characteristics, and in particular, good longitudinal elongation ($d_{33}$) and a low dielectric loss factor (tan δ) even at a high Curie temperature Tc; as well as a ceramic material having a good electromechanical coupling factor (Kp).

A further object of the present invention is to provide laminated piezoelectric elements and piezoelectric elements employing the above ceramic materials.

SUMMARY OF THE INVENTION

The present inventors conducted extensive research with the aim of developing a PZT ceramic material having good piezoelectric characteristics that could be sintered at low temperature. As a result, they discovered that sintering of a PZT ceramic material comprising prescribed elements was possible by calcination at a temperature of less than or equal to 950° C., and that this material afforded good piezoelectric characteristics; the present invention was devised on this basis.

That is, the object of the present invention is achieved by a ceramic material characterized by being denoted by the general formula $ABO_d$ (where d denotes the total number of oxygen atoms contained in oxide A and oxide B); comprised primarily of Pb, Zr, and Ti; in which A in said general formula denotes $(Pb_{1-a}M^1_{a-b})$ (where $0<a<0.08$, $0<b<0.075$, and $M^1$ is selected from the group consisting of group 3A elements, Li, Na, K, Mg, Ca, and Sr).

The object of the present invention is also achieved by a ceramic material characterized by being denoted by the general formula $ABO_d$ (where d denotes the total number of oxygen atoms contained in oxide A and oxide B); comprised primarily of Pb, Zr, and Ti; in which B in said general formula denotes $[(M^2_{1/3}Nb_{2/3-c})_\alpha Zr_\beta Ti_\gamma]$ (where $0.05<c<0.2$, $0.18<\alpha<0.28$, $0.36<\beta<0.44$, $0.36<\gamma<0.44$, and $M^2$ is one or more elements capable of forming at least a perovskite structure in the ceramic material).

The object of the present invention is also achieved by a ceramic material denoted by formula (1) below:

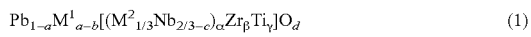

$$Pb_{1-a}M^1_{a-b}[(M^2_{1/3}Nb_{2/3-c})_\alpha Zr_\beta Ti_\gamma]O_d \qquad (1)$$

(where in formula (1), $M^1$ denotes one or more elements selected from among the group consisting of 3A group elements, Li, Na, K, Mg, Ca, and Sr; $M^2$ denotes three or more elements selected from among the group consisting of Mg, Ca, Sr, Cr, Mn, Fe, Co, Ni, and Zn; $0<a<0.08$, $0<b<0.075$, $0.05<c<0.2$, $0.18<\alpha<0.28$, $0.36<\beta<0.44$, $0.36<\gamma<0.44$; and d is the sum of the number of oxygen atoms contained in the oxides of Pb, $M^1$, $M^2$, Nb, Zr, and Ti).

The following are preferred modes of the ceramic material:

(1) The above ceramic material in which $M^1$ denotes one or more elements selected from among the group consisting of Sc, Y, La, Ce, Pr, Nd, Pm, Sm, Eu, Gd, Tb, Dy, Ho, Er, Tm, K, and Lu.

(2) The above ceramic material in which $M^1$ denotes one or more elements selected from among the group consisting of La and K.

(3) The above ceramic material in which $M^2$ denotes three or more elements selected from among the group consisting of Ni, Zn, Co, Mn, and Mg.

(4) The above ceramic material in which $M^2$ denotes Ni, Zn, and Co.

(5) The above ceramic material in which $\beta$ and $\gamma$ satisfy the relation of $0.92<\beta/\gamma<1.08$.

(6) The above ceramic material in which $\alpha$, $\beta$, and $\gamma$ satisfy the relation of $0\leq\alpha+\beta+\gamma\leq1.15$.

(7) The above ceramic material in which the piezoelectric strain constant $d_{33}$ in the longitudinal direction is greater than or equal to 850.

(8) The above ceramic material in which the dielectric loss factor tan δ is such that $0.003<\tan\delta<0.012$.

(9) The above ceramic material in which the Curie temperature Tc is greater than 250° C. and the relative dielectric constant $\epsilon_r$ is less than 2,300.

The object of the present invention is further achieved by a ceramic material characterized by being denoted by the general formula $ABO_d$ (where d denotes the total number of oxygen atoms contained in oxide A and oxide B); comprised primarily of Pb, Zr, and Ti; in which the piezoelectric strain constant $d_{33}$ in the longitudinal direction is greater than or equal to 850, the dielectric loss factor tan δ satisfies the relation of $0.003<\tan\delta<0.012$, the Curie temperature Tc is greater than 250° C., and the relative dielectric constant $\epsilon_r$ is less than 2,300.

The following are preferred modes of the above ceramic material:

(1) The above ceramic material further comprising one or more elements selected from among the group consisting elements of groups 1A to 2B in the $IV^{th}$ period, elements of groups 1A to 3A and 6A in the $V^{th}$ period, and elements of groups 1A to 6A in the $VI^{th}$ period.

(2) The above ceramic material further comprising one or more elements selected from among the group consisting of Sc, Y, La, Ce, Pr, Nd, Pm, Sm, Eu, Gd, Tb, Dy, Ho, Er, Tm, K, Lu, Ni, Zn, Co, Mn, and Mg.

The above ceramic material has a stoichiometric or non-stoichiometric composition, has good elongation in the longitudinal direction (a high piezoelectric strain constant ($d_{33}$) in the longitudinal direction), and exhibits good piezoelectric characteristics with a low dielectric loss (a low dielectric loss factor tan δ). Thus, since the ceramic material of the present invention can realize desired elongation even in a small element and affords the advantage of generating little heat during use, it is well-suited to uses such as piezoelectric elements such as piezoelectric actuators, particularly laminated piezoelectric elements and laminated piezoelectric transducers.

A further preferred mode of the ceramic of the present invention is the ceramic material denoted by general formula (2) below:

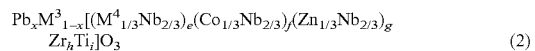

$$Pb_xM^3_{1-x}[(M^4_{1/3}Nb_{2/3})_e(Co_{1/3}Nb_{2/3})_f(Zn_{1/3}Nb_{2/3})_g Zr_hTi_i]O_3 \qquad (2)$$

(where in formula (2), $M^3$ denotes one or more elements selected from among the group consisting of La, K, Er, and Yb; $M^4$ denotes an element selected from among the group consisting of Ni, Mn, and Sr; $0.990\leq x\leq 0.997$; $0\leq e\leq 0.22$; $0<f<0.22$; $0<g<0.22$; $0.38\leq h\leq 0.43$; $0.38\leq i\leq 0.41$; $0.18\leq e+f+g\leq 0.22$; and $e+f+g+h+i=1$).

Since the ceramic material of the present invention denoted by formula (2) exhibits a stoichiometric composition and can be prepared by sintering through calcination at a temperature of less than or equal to 950° C., simultaneous sintering with an internal electrode in the form of a silver-palladium alloy (Ag70-Pd30) or some other element with a low melting point is possible. Further, since the ceramic material also exhibits good piezoelectric characteristics, it is extremely well-suited to the manufacturing of piezoelectric elements such as piezoelectric actuators, and particularly well-suited to laminated piezoelectric elements.

In the ceramic material of the present invention, $M^3$ of formula (2) may be K or La. Further, in the ceramic material of the present invention, $M^4$ in formula (2) may be Ni, Mn, or Sr, with Ni being preferred. Further, the density of the ceramic material of the present invention may be greater than or equal to 7.6 g/cm³.

The present invention relates to piezoelectric elements having a member comprising the ceramic material of the present invention and at least one pair of electrodes, and to laminated piezoelectric elements comprising a structural member in which a material comprised of the ceramic material of the present invention and electrodes are alternately laminated.

Further, the electrode of the laminated piezoelectric element may be an electrode comprised of Cu, Ag, an Ag—Pt alloy, or an Ag—Pd alloy.

MODES OF IMPLEMENTING THE INVENTION

Modes of implementing the present invention are described in detail below.

The first ceramic material of the instant invention is characterized by being denoted by the general formula $ABO_d$ (where d denotes the total number of oxygen atoms contained in oxide A and oxide B); comprised primarily of Pb, Zr, and Ti; in which A in said general formula denotes $(Pb_{1-a}M^1_{a-b})$ (where $0<a<0.08$, $0<b<0.075$).

The first ceramic material of the instant invention is primarily comprised of Pb, Zr, and Ti, with Pb being incorporated at A (referred to hereinafter as "site A") and Zr and Ti being incorporated at B (referred to hereinafter as "site B"). Site A is denoted by $Pb_{1-a}M^1_{a-b}$. The ceramic material of claim 1 includes both the ilmenite and perovskite structures; when employed as a piezoelectric material, the perovskite structure is preferred from the perspective of piezoelectric characteristics. In $Pb_{1-a}M^1_{a-b}$, since b is greater than 0, the sum of the atomic ratio of Pb and $M^1$ ($(1-a)+(a-b)$) is less than 1, and site A denotes a nonstoichiometric composition. The a value of site A is defined as falling within the range of $0<a<0.08$, preferably $0<a<0.06$, more preferably $0.01<a<0.05$. The a value of site A is defined within the range of $0<a<0.08$ to introduce oxygen defects, with it being particularly desirable to introduce oxygen defects into the perovskite structure. Value b is defined with the range of $0<b<0.075$. A value lower than value a may be suitably selected, with $0<b<0.06$ being preferred and $0.01<b<0.06$ being more preferred. Value b is defined within the range of $0<b<0.75$ to introduce oxygen defects, it being particularly desirable to introduce oxygen defects into the perovskite structure.

$M^1$ at site A is a metal element that is not specifically limited as far as it permits the formation of a perovskite structure in the PZT ceramic material. It is desirably one or more elements selected from among the group consisting of group 3A elements and Li, Na, K, Mg, Ca, and Sr; preferably one or more elements selected from among the group consisting of Sc, Y, La, Ce, Pr, Nd, Pm, Sm, Eu, Gd, Tb, Dy, Ho, Er, Tm, K, and Lu; and more preferably La, K, or both.

Site B comprises an element capable of forming a perovskite structure in the PZT ceramic material, and comprises at least Zr and Ti. The ratio of Zr to Ti is not specifically limited. However, from the perspective of achieving high electromechanical coupling (Kp), a range of $0.92<Zr/Ti<1.08$ is desirable. Site B may comprise other elements in addition to Zr and Ti. These additional elements are not specifically limited. However, they may be suitably selected within a range maintaining piezoelectric characteristics. However, site B may itself have a nonstoichiometric or stoichiometric composition, and may have either a nonstoichiometric or stoichiometric composition in combination with site A.

Total number of oxygen atoms d in the first ceramic material of the instant invention is the sum of the number of oxygen atoms contained in oxide A and oxide B. Oxide A means the oxide in which Pb and $M^1$ have the most stable structures. Further, oxide B means the oxide having the most stable structure of the metal elements contained in B, including the Zr and Ti. Specific examples will be given further below.

The second ceramic material of the instant invention is characterized by being denoted by the general formula $ABO_d$ (where d denotes the total number of oxygen atoms contained in oxide A and oxide B); comprised primarily of Pb, Zr, and Ti; in which B in said general formula denotes $[(M^2_{1/3}Nb_{2/3-c})_\alpha Zr_\beta Ti_\gamma]$ (where $0.05<c<0.2$, $0.18<\alpha<0.28$, $0.36<\beta<0.44$, and $0.36<\gamma<0.44$).

In this ceramic material, site B is denoted by $[(M^2_{1/3}Nb_{2/3-c})_\alpha Zr_\beta Ti_\gamma]$ and $M^2$ is not specifically limited as far as it be an element capable of forming at least a perovskite structure in the PZT ceramic material. $M^2$ preferably denotes three or more elements selected from among the group consisting of Mg, Ca, Sr, Cr, Mn, Fe, Co, Ni, and Zn; more preferably denotes three or more elements selected from among the group consisting of Ni, Zn, Co, Mn, and Mg; and most preferably denotes Ni, Zn, and Co.

$[(M^2_{1/3}Nb_{2/3-c})_\alpha Zr_\beta Ti_\gamma]$ includes the cases where, when c, $\alpha$, $\beta$ and $\gamma$ are within the above-stated ranges, the sum of the atomic ratios of $M^2$, Nb, Zr, and Ti is less than 1, equal to 1, and greater than 1. When the sum of these atomic ratios is smaller or greater than 1, site B denotes a nonstoichiometric composition. When the total of these atomic ratios is equal to 1, site B denotes a stoichiometric composition. That is, site B in the second ceramic material of the instant invention may be a nonstoichiometric or stoichiometric composition depending on values c, $\alpha$, $\beta$, and $\gamma$.

Value c of site B may be suitably selected within the range of $0.05<c<0.2$. Value c is confined to within the range of $0.05<c<0.2$ to keep dielectric loss factor tan δ low; a range of $0.05<c<0.18$ is preferred and a range of $0.06<c<0.15$ is more preferred.

$\alpha$, $\beta$, and $\gamma$ of site B may be suitably selected within the ranges of $0.18<\alpha<0.28$, $0.36<\beta<0.44$, and $0.36<\gamma<0.44$. Value $\alpha$ is limited to within the range of $0.18<\alpha<0.28$ to maintain a high Curie temperature; a range of $0.19<\alpha<0.27$ is preferred and a range of $0.2<\alpha<0.25$ is more preferred. Values $\beta$ and $\gamma$ are confined to within the range of $0.36<\beta<0.44$ to achieve a high strain constant in the longitudinal direction; a range of $0.38<\beta<0.42$ is preferred and a range of $0.40<\beta<0.42$ is more preferred.

Site A comprises an element capable of forming a perovskite structure in the PZT ceramic material, consisting of at least Pb. Other elements may be incorporated into site A in addition to Pb. These additional elements are not specifically limited, and may be suitably selected within a range maintaining piezoelectric characteristics.

Site A may itself have a nonstoichiometric structure or a stoichiometric structure, and may have a nonstoichiometric or stoichiometric structure in combination with site B.

The ratio of value $\beta$ to value $\gamma$ ($\beta/\gamma$) serves as an index of the MPB boundary (phase boundary), with a range of $0.92<\beta/\gamma<1.08$ being desirable, a range of $0.92<\beta/\gamma<1.06$ being preferred, and a range of $0.93<\beta/\gamma<1.03$ being more preferred.

The value $\alpha+\beta+\gamma$ is desirably $1.0\leq\alpha+\beta+\gamma\leq1.15$, preferably $1.01\leq\alpha+\beta+\gamma\leq1.08$. The value of $\alpha+\beta+\gamma$ is desirably limited to the range of $1.0\leq\alpha+\beta+\gamma\leq1.15$ from the perspective of the quantity of oxygen defects in a crystalline structure having a perovskite structure.

The third ceramic material of the instant invention is denoted by formula (1) below:

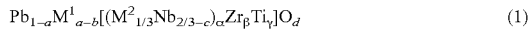

$$Pb_{1-a}M^1_{a-b}[(M^2_{1/3}Nb_{2/3-c})_\alpha Zr_\beta Ti_\gamma]O_d \quad (1)$$

In formula (1), $M^1$ denotes one or more elements selected from among the group consisting of 3A group elements, Li, Na, K, Mg, Ca, and Sr; preferably one or more elements selected from among the group consisting of Sc, Y, La, Ce, Pr, Nd, Pm, Sm, Eu, Gd, Tb, Dy, Ho, Er, Tm, K, and Lu; and more preferably one or more elements selected from among the group consisting of La and K. $M^2$ denotes three or more elements selected from among the group consisting of Mg, Ca, Sr, Cr, Mn, Fe, Co, Ni, and Zn; preferably three or more elements selected from among the group consisting of Ni, Zn, Co, Mn, and Mg; and more preferably, Ni, Zn, and Co.

In the ceramic material of formula (1) above, since b is greater than 0, the sum of the atomic ratios of Pb and $M^1$ $((1-a)+(a-b))$ is less than 1 in $Pb_{1-a}M^1_{a-b}$ (site A), and site A denotes a nonstoichiometric composition. Further, $[(M^2_{1/3}Nb_{2/3-c})_\alpha Zr_\beta Ti_\gamma]$ (site B) covers the cases where, within the above-stated ranges of c, α, β, and γ, the sum of the atomic ratios of $M^2$, Nb, Zr, and Ti is less than 1, equal to 1, or greater than 1. When the sum of the atomic ratios at site B is less than or greater than 1, site B denotes a nonstoichiometric composition, and when the sum of the atomic ratio is equal to 1, site B denotes a stoichiometric composition. That is, site B of the third ceramic material of the instant invention may denote a nonstoichiometric or stoichiometric composition depending on the values of c, α, β, and γ.

Further, sites A and B in combination, as site AB, may denote a nonstoichiometric or stoichiometric composition.

The values of a, b, c, α, β, and γ in formula (1) fall within the ranges of $0<a<0.08$, $0<b<0.075$, $0.05<c<0.2$, $0.18<\alpha<0.28$, $0.36<\beta<0.44$, and $0.36<\gamma<0.44$, respectively. The reasons these numeric ranges have been established, and the preferred numeric ranges therein, are identical to those given in the description of the first ceramic material and second ceramic material of the instant invention above.

In formula (1), d is the sum of the number of oxygen atoms contained in each of the oxides formed by Pb, $M^1$, $M^2$, Nb, Zr, and Ti. Here, the oxides formed by Pb, $M^1$, $M^2$, Nb, Zr, and Ti refer to those oxides having the most stable structures among the oxides formed by bonding of Pb, $M^1$, $M^2$, Nb, Zr, and Ti with oxygen atoms. Examples of these oxides are PbO, $Nb_2O_5$, $ZrO_2$, and $TiO_2$ for Pb, Nb, Zr, and Ti.

More specifically, when, for example, $M^1$ denotes La and $M^2$ denotes Ni, the above-mentioned various oxides refer to PbO, $La_2O_3$, NiO, $Nb_2O_5$, $ZrO_2$, and $TiO_2$. Here, since d denotes the sum of the number of oxygen atoms of each of the oxides, the sum $[(1-a)+(a-b)\times 3/2+\alpha\times 1/3+\alpha\times(2/3-c)\times 5/2+2\beta+2\gamma]$ can be calculated from the $(1-a)$ of PbO, $(a-b)\times 3/2$ of $La_2O_3$, $\alpha\times 1/3$ of NiO, $\alpha\times(2/3-c)\times 5/2$ of $Nb_2O_5$, $2\beta$ of $ZrO_2$, and $2\gamma$ of $TiO_2$.

In the present invention, piezoelectric strain constant $d_{33}$ in the longitudinal direction denotes the elongation of the ceramic material in the longitudinal direction when a voltage is applied. The ceramic material of the present invention desirably has a $d_{33}$ of greater than or equal to 850, preferably greater than or equal to 880, and more preferably greater than or equal to 900 from the perspective of controlling power consumption, reducing heat generation, and achieving response speed.

Further, the dielectric loss factor tan δ in the present invention is a factor indicating dielectric loss. In the ceramic material of the present invention, the dielectric loss factor tan δ is desirably $0.003<\tan \delta<0.012$, preferably $0.003<\tan \delta<0.010$, and more preferably $0.003<\tan \delta<0.008$ from the perspectives of reducing electrostatic energy losses and preventing heat generation by the laminated piezoelectric ceramic.

In the ceramic material of the present invention, the Curie temperature Tc is desirably greater than 250° C. and the relative dielectric constant $\epsilon_r$ is desirably less than 2,300 from the perspectives of permitting use at high temperature and the power employed. Further, the Curie temperature Tc is preferably 280° C. or above, more preferably 300° C. or above. Relative dielectric constant $\epsilon_r$ is preferably less than 2,200 and more preferably less than 2,000.

The fourth ceramic material of the instant invention is denoted by general formula $ABO_d$ (where d denotes the sum of the number of oxygen atoms contained in oxide A and oxide B). This ceramic material is a compound oxide comprising primarily Pb, Zr, and Ti. It is characterized in that the piezoelectric constant $d_{33}$ in the longitudinal direction is greater than or equal to 850, the dielectric loss factor tan δ is $0.003<\tan \delta<0.012$, the Curie temperature Tc is greater than 250° C., and the relative dielectric constant $\epsilon_r$ is less than 2,300.

This ceramic material is comprised of a composite oxide the principal components of which are Pb, Zr, and Ti. Elements other than Pb, Zr, and Ti may be incorporated to the extent that at least a perovskite structure be formed. Examples of such elements are one or more elements selected from among the group consisting of elements of groups 1A to 2B in the $IV^{th}$ period, elements of groups 1A to 3A and 6A in the $V^{th}$ period, and elements of groups 1A to 6A in the $VI^{th}$ period, with one or more elements selected from among the group consisting of Sc, Y, La, Ce, Pr, Nd, Pm, Sm, Eu, Gd, Tb, Dy, Ho, Er, Tm, K, Lu, Ni, Zn, Co, Mn, and Mg being preferred.

In previous ceramic materials, the longitudinal piezoelectric constant $d_{33}$ tended to decrease when the Curie temperature Tc rose and the dielectric loss factor tan δ and the relative dielectric constant $\epsilon_r$ both tended to increase when the longitudinal piezoelectric constant $d_{33}$ was increased. Accordingly, the present inventors conducted extensive research, resulting in the discovery of a ceramic material having a high longitudinal piezoelectric constant $d_{33}$ when the Curie temperature Tc was high, as well as having a low dielectric loss factor tan δ and relative dielectric constant $\epsilon_r$ not seen in previous ceramic materials; the ceramic material of the present invention was designed on this basis.

That is, the fourth ceramic material of the instant invention is characterized by, even at a Curie temperature Tc of greater than or equal to 250° C., exhibiting good piezoelectric characteristics, in the form of a longitudinal piezoelectric strain constant $d_{33}$ of greater than or equal to 850, a dielectric loss factor tan δ of $0.003<\tan \delta<0.012$, and a relative dielectric constant $\epsilon_r$ of less than 2,300.

A ceramic material having the above characteristics can be obtained by combining and suitably adjusting the above-listed elements. For example, a ceramic material with a Curie temperature Tc of greater than or equal to 250° C. is prepared by adjusting the quantity of elements employed in $M^2$. Further, to achieve a longitudinal piezoelectric distortion constant $d_{33}$ of greater than or equal to 850, the types and quantities of elements added to $M^1$ are adjusted. Further, to achieve a dielectric loss factor tan δ of $0.003<\tan \delta<0.012$, value α is adjusted. It is thus possible to manufacture the fourth ceramic material of the instant invention by adjusting the composition and compositional ratio so that Tc, $d_{33}$, and tan δ fall within prescribed ranges.

More specifically, the composite oxide $Pb_{1-a}M^1{}_{a-b}[(M^2{}_{1/3}Nb_{2/3-c})_\alpha Zr_\beta Ti_\gamma]O_d$ (wherein $M^1$ denotes one or more elements selected from among the group consisting of group 3A elements, Li, Na, K, Mg, Ca, and Sr; $M^2$ denotes three or more elements selected from among the group consisting of Mg, Ca, Sr, Cr, Mn, Fe, Co, Ni, and Zn; $0<a<0.08$, $0<b<0.075$, $0.05<c<0.2$, $0.18<\alpha<0.28$, $0.36<\beta<0.44$, $0.36<\gamma<0.44$; and d is the sum of the number of oxygen atoms contained in the oxides of Pb, $M^1$, $M^2$, Nb, Zr, and Ti) comprised primarily of Pb, Zr, and Ti is an example of a ceramic material exhibiting the above-described desired Tc, $d_{33}$, and tan δ.

The fifth ceramic material of the instant invention satisfies formula (2) below.

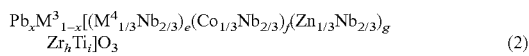

(2)

In formula (2), $M^3$ denotes one or more elements selected from among the group consisting of La, K, Er, and Yb. $M^3$ may function as a donor or acceptor. In the ceramic material of the present invention, $M^1$ desirably denotes La or K.

In formula (2), value x is such that $0.990 \leq x \leq 0.997$. Value x is not specifically limited as far as it fall within the range of $0.990 \leq x \leq 0.997$. Value x has been set to be 0.990 or more because, below this value, sintering does not adequately progress even with calcination up to 1,000° C.; the density of the sintered product obtained is low; and piezoelectric characteristics (particularly the electromechanical coupling factor: Kp) decrease abruptly. When the calcination temperature is set high, to about 1,200° C., sintering progresses adequately even when value x is less than or equal to 0.990. However, when the calcination temperature is raised to about 1,200° C., the internal electrode of a silver-palladium alloy such as Ag70-Pd30 melts, and there is a high possibility of a short-circuit occurring when the power is engaged. Value x has been made less than or equal to 0.997 because when value x exceeds this numeric value, piezoelectric characteristics, particularly the electromechanical coupling factor (Kp), decrease.

The value e+f+g of formula (2) is not specifically restricted other than that $0.18 \leq e+f+g \leq 0.22$, $0 \leq e < 0.22$, $0 < f < 0.22$, and $0 < g < 0.22$. The value e+f+g has been set to greater than or equal to 0.18 because when lower than this value, effect of the presence of solid solution $(M^4{}_{1/3}Nb_{2/3})_e (Co_{1/3}Nb_{2/3})_f (Zn_{1/3}Nb_{2/3})_g$ does not take place and the calcination temperature cannot be reduced. The value of e+f+g has been set to less than or equal to 0.22 because when value e exceeds this value, piezoelectric characteristics (particularly electromechanical coupling factor: Kp) decrease. This is because the $Pb(Zr,Ti)O_3$ component with high piezoelectric characteristics decreases.

Further, the reason for setting $0 \leq e < 0.22$, $0 < f < 0.22$, and $0 < g < 0.22$ is that when values e and f fall within this range, sintering can be conducted at a low calcination temperature of less than or equal to 1,000° C. and good piezoelectric characteristics (particularly electromechanical coupling factor: Kp) are achieved.

Further, values h and i in formula (2) above are not specifically limited other than that $0.38 \leq h \leq 0.43$ and $0.38 \leq i \leq 0.41$. Value h has been set to the range of $0.38 \leq h \leq 0.43$ and value e to the range of $0.38 \leq e \leq 0.41$ because outside of these ranges, the electromechanical coupling factor (Kp) decreases sharply in the PZT ceramic material, precluding the achievement of high-voltage characteristics.

Values e through i are adjusted so that e+f+g+h+i=1. The value of 1 of e+f+g+h+i in the present invention also includes values greater than or equal to 0.995 and less than 1.005, for example. When the value of e+f+g+h+i exceeds 1, components are present in excess of the stoichiometric composition of the ceramic material of the present invention, with the possibility that these excess components will precipitate out at crystal grain boundaries and block domain switching, precluding the obtaining of good piezoelectric characteristics. When the value of e+f+g+h+e is less than 1, the components of the ceramic material of the present invention are present in quantities less than the stoichiometric composition, sometimes resulting in undesirable lattice defects and decreased piezoelectric characteristics.

In formula (2), $M^4$ denotes an element capable of forming a perovskite structure in the form of Ni, Mn, or Sr. When $M^4$ denotes Ni, the piezoelectric constant can be increased. When $M^4$ denotes Mn and Sr, it is possible to decrease the dielectric loss while maintaining the piezoelectric constant. $M^2$ desirably denotes Ni. Any one from among Ni, Mn, and Sr may have a bivalent atomic valence when incorporated into site B (the site of Zr and Ti) of the ceramic material of the present invention.

Generally, the greater the degree to which sintering of the ceramic starting materials progresses, the greater the density of the ceramic material of the present invention denoted by formula (2) tends to be. Further, ceramic materials of high density generally exhibit good piezoelectric characteristics (particularly electromechanical coupling factor: Kp). Accordingly, the ceramic material of the present invention preferably has a density following preparation of at least greater than or equal to 7.6 g/cm³, more preferably greater than or equal to 7.7 g/cm³.

The ceramic material of the present invention can be manufactured in the same manner as conventional products. Starting materials in the form of powders of the oxides of the constituent metals, that is, PbO, CoO, ZnO, NiO, $La_2O_3$, $K_2CO_3$, $Nb_2O_5$, $TiO_2$, and $ZrO_2$, are blended for use in a ratio yielding the desired composition. Compounds producing the above-described metal oxides when thermally decomposed during calcination may also be employed as starting materials. For example, $Pb_3O_4$ may be employed for PbO, and a carbonate, basic carbonate, hydroxide, carboxylate, or the like may be employed instead of an oxide. It is also possible to employ an oxide or carbonate containing two or more constituent metals.

The starting materials may comprise impurities in the form of unavoidable contaminants so long as they do not markedly affect the piezoelectric characteristics of the present invention. For example, $ZrO_2$ often contains a trace amount of $HfO_2$ and $Nb_2O_5$ often contains a trace amount of $Ta_2O_5$; such starting materials may be employed.

The blended starting materials are thoroughly mixed, normally by wet mixing. The mixed powder can be molded as is, but is normally calcinated at low temperature to render the composition more uniform, the calcinated mixture is pulverized, and the powder obtained is molded.

The ceramic material can be molded into a desired form based on the use of the piezoelectric material. For example, molding may be conduced by compression molding (press molding), hot pressing, and pressure molding by hydrostatic pressing. A small amount of organic binder may be employed in molding. Examples of such organic binders are polyvinyl alcohol, carboxymethyl cellulose, wax, polyvinyl butylal, acrylic, and the like.

The molded product obtained is then sintered at a calcination temperature of 1,000° C. or lower, yielding the ceramic material of the present invention. Sintering progresses adequately and the ceramic material of the present invention is obtained even when the calcination temperature is 1,000° C. or less. The calcination temperature is preferably 900 to 1,000° C., more preferably 900 to 950° C. In particular, the ceramic materials of the instant invention described above are capable of being sintered well at a temperature of 950° C. or less. The period of calcination of the molded product at a calcination temperature of 1,000° C. or less may be suitably determined based on the ceramic materials of the present invention that are to be obtained.

Although the calcination atmosphere is not specifically limited, calcination is normally conducted in air. When employing an electrode of a noble metal or a metal that oxidizes comparatively easily, calcination is desirably conducted in an atmosphere of inert gas such as nitrogen to prevent an oxidation reaction.

The electrode is affixed to the sintered product and polarization processing (for example, applying a direct current voltage in silicon oil) is conducted by the usual method, yielding a piezoelectric element. The metals and noble metals normally employed as electrodes may be employed as electrodes in piezoelectric elements having components comprising the ceramic materials of the present invention.

Further, the ceramic materials of the present invention may be employed as the laminated piezoelectric element utilized in a laminated piezoelectric actuator. So long as the laminated piezoelectric element of the present invention has a laminated member obtained by alternately laminating a member comprised of ceramic materials and an internal electrode, the number of laminations of the member comprised of ceramic materials is not specifically limited. Thus, the number of laminations may be suitably determined in accordance with the desired applied voltage and amount of displacement. Nor is the thickness of individual layers specifically limited; a suitable thickness may be selected based on the applied voltage.

The piezoelectric materials in the laminated piezoelectric element are generally molded into sheets. That is, the starting materials are molded, calcinated, and pulverized to obtain a powder as set forth above. This powder is mixed with a suitable organic binder solution to form a slurry, and the slurry is shaped into a sheet or tape form of constant thickness with a doctor blade or the like. The sheet or tape obtained is dried to remove the greater portion of the solvent, yielding a green sheet.

A conductive paste for forming an internal electrode is coated in a desired shape by screen printing or the like on the green sheet. The ceramic materials employed in the laminated piezoelectric element of the present invention may be simultaneously sintered with the internal electrode even at calcination temperatures of less than or equal to 1,000° C. Thus, conductive pastes suitable for use in the laminated piezoelectric element of the present invention include, in addition to the conductive pastes normally employed as internal electrodes, noble metals and metals with melting points of less than 1,000° C. (for example, copper and silver), Ag—Pt alloys, Ag—Pd alloys with small amounts of palladium blended in (for example, less than or equal to 10 weight percent Pd). Thus, in the laminated piezoelectric element of the present invention, the internal electrode does not melt, the diffusion of Ag is prevented, the potential for short-circuiting is low, and inexpensive metals and alloys can be employed as the internal electrode. Thus, the cost of manufacturing piezoelectric elements can be greatly reduced.

The green sheet that has been coated with the above-described conductive paste is cut to suitable dimensions, a suitable number of sheets are stacked (for example, from 10 to 100 sheets), the sheets are hot pressed into a single body, and the laminate obtained is calcinated to simultaneously sinter the internal electrode and the sheet-shaped molded product. The calcination conditions here are identical to those above. External electrodes are attached to the sintered product so that the polarization directions of each of the layers are opposed. When a voltage is applied to induce polarization, a laminated piezoelectric element is obtained that is useful as a laminated piezoelectric actuator.

The piezoelectric element obtained in this manner may be employed in various applications of piezoelectric ceramics such as vibrators, resonators, piezo-couplers, mechanical filters, piezo-transducers, delaying devices for communicators and the like, pressure gauges, flow meters, windflow meters, various other measurement devices, pickups, microphones, television remote controls, other acoustic devices, ultrasonic diagnostic devices, piezo-pumps, ultrasonic motors, and piezoelectric actuators.

EXAMPLES

The present invention is described in greater detail below through examples. The starting materials, reagents, proportions, operations, and the like indicated in the examples may be suitably modified without departing from the spirit of the present invention. Accordingly, the scope of the present invention is not specifically limited to the examples given below.

Example 1

Starting material powders of PbO, $ZrO_2$, $TiO_2$, ZnO, CoO, NiO, $Nb_2O_5$, and $La_2O_3$ or $K_2CO_3$ were weighed out in the prescribed ratios indicated in Table 1 in compositional formulas satisfying the conditions of $Pb_{1-a}M^1_{a-b}[(M^2_{1/3}Nb_{2/3-c})_\alpha Zr_\beta Ti_\gamma]O_d$, and intimately wet mixed with a ball mill.

<Conditions of the Compositional Formulas>

$M^1$: K was employed in Sample 9. La was employed in Samples 1 to 8 and 10 to 16.

$M^2$: Sr, Ni, and Zn were employed in Sample 4. Co, Ni, and Zn were employed in samples 1 to 3 and 5 to 16.

The mixed powders obtained were calcinated for 2 hours at 900° C. in air and then wet pulverized again with a ball mill.

A 2 weight percent quantity of organic binder (polyvinyl alcohol) was admixed to the powder pulverized as set forth above and the mixture was passed through a 150 micrometer mesh to obtain powder. The powder obtained was compression molded into disks measuring 20 mm in diameter and 2 mm in thickness at a pressure of 3 tons/cm². The molded members obtained were then calcinated for 2 hours at 1,000° C. in air in an MgO vessel.

Both surfaces of the disk-shaped sintered members obtained were ground to adjust the thickness to 1 mm and the density was calculated by Archimedes' method. Subsequently, a commercially available conductive past containing conductive powder in the form of silver was coated on both surfaces of the disk-shaped sintered members, calcination was conducted for 30 min. at 750° C. in air to form electrodes, and polarization was conducted by applying a direct current voltage of 3 kV in 100° C. silicon oil for 30 min.

The results of measurement of the piezoelectric characteristics of each of the ceramic materials conducted at least 24 hours after the polarization treatment are given with the results of density calculation in Table 1. The Kp in the table is the electromechanical coupling factor in the direction of thickness, $\epsilon_r$ is the relative dielectric constant in the direction of thickness, $d_{33}$ is the piezoelectric strain constant in the longitudinal direction, Tc is the Curie temperature, and tan δ is the dielectric loss factor.

Methods of Computing the Various Values

1. Electromechanical Coupling Factor Kp and Relative Dielectric Constant $\epsilon_r$ Kp and $\epsilon_r$ were measured in accordance with the piezoelectric ceramic oscillator test method (EMAS-6001) of the Electronic Materials Industry Association set out in the standard specifications of the Electronic Materials Industry Association.

$\epsilon_r$ was obtained by measuring the electrostatic capacitance at 25° C. of test samples of the shape specified in Standard Specification EMAS-6001 of the Electronic Materials Industry Association with a Hewlett-Packard Japan Impedance Analyzer HP4192A, followed by calculation with the following equation (3):

$$\epsilon_r = \epsilon^T_{33}/\epsilon_0 = tC/\epsilon_0 S \qquad (3)$$

(where $\epsilon_0$ denotes the relative dielectric-constant in vacuum ($8.854 \times 10^{-12}$ F/m), t denotes the distance (m) between the two electrodes, C denotes the electrostatic capacitance (F), and S denotes the electrode surface area ($m^2$)).

2. Piezoelectric Strain Constant $d_{33}$

Piezoelectric strain constant $d_{33}$ was obtained by measuring with a laser displacement meter the elongation in an electric field intensity of 1.4 kV/mm of samples of the shape specified in Standard Specification EMAS-6002 of the Electronic Materials Industry Association, which specifies a method of measuring the longitudinal vibration of columnar vibrators, and calculating piezoelectric strain constant $d_{33}$ from the measured values.

3. Curie Temperature Tc

In measurement of the Curie temperature Tc, changes in electrostatic capacitance caused by varying the temperature of a sample in a furnace were recorded, and the temperature exhibiting the maximum electrostatic capacitance was adopted as Curie temperature Tc.

4. Dielectric Loss Factor tan δ

In the same manner as for relative dielectric constant $\epsilon_r$, diffusion coefficient tan δ was measured at a frequency of 1 kHz using test samples of the shape specified in Standard Specification EMAS-6001 of the Electronic Materials Industry Association with a Hewlett-Packard Japan Impedance Analyzer HP4192A.

In Samples 1, 4, 8, 9, 11, and 14 in which values a, b, c, α, β, and γ all fell within the ranges given by 0<a<0.08, 0<b<0.075, 0.05<c<0.2, 0.18<α<0.28, 0.36<β<0.44, and 0.36<γ<0.44 based on Table 1, even when Curie temperature Tc was greater than or equal to 300° C., piezoelectric strain constant $d_{33}$ was greater than or equal to 850, indicating good elongation. When values a through γ were either larger or smaller than the stated ranges, elongation ($d_{33}$) dropped. Further, it was possible to increase electromechanical coupling factor Kp to greater than or equal to 60 and decrease relative dielectric constant $\epsilon_r$ to less than or equal to 2,300. Further, dielectric loss factor tan δ fell within the range of 0<tan δ<0.012 in each of Samples 1, 4, 8, 9, 11, and 14.

The values measured for Sample 9 and Samples 1, 4, 8, 11, and 14 indicated that K and La were the $M^1$ of preference. The values measured for Sample 4 and Samples 1, 8, 9, 11, and 14 indicated that the combination of Sr, Ni, and Zn and the combination of Co, Ni, and Zn were the $M^2$ combination of preference.

The β/γ value of Samples 6, 10, and 18 exceeded 1.08 and that of Sample 13 fell below 0.92. Both Kp and $d_{33}$ were low in these samples. Samples having a numerical value of β/γ falling within the range of 0.92<β/γ<1.08 were preferred from the perspective of obtaining relatively high Kp and $d_{33}$ levels.

When the value of α+β+γ was lower than 1 (Sample 15), both Kp and $d_{33}$ were low and there was little longitudinal elongation with the application of voltage. A value of α+β+γ of greater than or equal to 1 was thus found to be desirable from the perspective of obtaining a higher Kp and $d_{33}$.

Example 2

Starting material powders of PbO, $ZrO_2$, $TiO_2$, ZnO, CoO, NiO, and $Nb_2O_5$ with either $La_2O_3$ or $K_2CO_3$ were weighed out in the prescribed ratio indicated in Table 2 in compositional formulas satisfying the conditions of

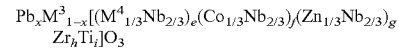

and intimately wet mixed in a ball mill.

<Conditions of the Compositional Formulas>

$M^3$: La was employed in Samples 17 to 33. K was employed in Sample 33.

$M^4$: Ni was employed in all samples.

TABLE 1

| Sample No | a | b | c | α | β | γ | β/γ | α + β + γ | Density [g/cm³] | Kp | $\epsilon_r$ | $d_{33}$ | Tc | tan δ | Remarks |
|---|---|---|---|---|---|---|---|---|---|---|---|---|---|---|---|
| 1 | 0.015 | 0.009 | 0.120 | 0.23 | 0.41 | 0.40 | 1.025 | 1.04 | 7.90 | 63.1 | 2010 | 881 | 321 | 0.004 | |
| 2 | 0.017 | 0.012 | 0.230 | 0.26 | 0.38 | 0.36 | 1.056 | 1.00 | 7.88 | 58.7 | 2465 | 683 | 316 | 0.016 | ※ |
| 3 | 0.018 | 0.011 | 0.100 | 0.15 | 0.42 | 0.44 | 0.955 | 1.01 | 7.78 | 56.8 | 2542 | 762 | 335 | 0.012 | ※ |
| 4 | 0.018 | 0.014 | 0.065 | 0.20 | 0.40 | 0.43 | 0.930 | 1.03 | 7.98 | 62.7 | 2270 | 870 | 330 | 0.010 | |
| 5 | 0.023 | 0.019 | 0.140 | 0.30 | 0.37 | 0.35 | 1.057 | 1.02 | 7.88 | 59.7 | 2731 | 653 | 318 | 0.013 | ※ |
| 6 | 0.028 | 0.020 | 0.050 | 0.23 | 0.42 | 0.38 | 1.105 | 1.03 | 7.75 | 60.5 | 2483 | 735 | 337 | 0.015 | ※ |
| 7 | 0.030 | 0.020 | 0.150 | 0.15 | 0.43 | 0.42 | 1.024 | 1.00 | 7.87 | 61.0 | 2350 | 796 | 326 | 0.009 | ※ |
| 8 | 0.035 | 0.028 | 0.120 | 0.21 | 0.40 | 0.41 | 0.976 | 1.02 | 7.98 | 63.8 | 2198 | 879 | 320 | 0.005 | |
| 9 | 0.035 | 0.028 | 0.120 | 0.21 | 0.40 | 0.41 | 0.976 | 1.02 | 7.96 | 62.9 | 2275 | 851 | 318 | 0.008 | |
| 10 | 0.040 | 0.030 | 0.070 | 0.15 | 0.45 | 0.41 | 1.098 | 1.01 | 7.65 | 60.8 | 2512 | 705 | 332 | 0.021 | ※ |
| 11 | 0.043 | 0.035 | 0.140 | 0.25 | 0.40 | 0.42 | 0.952 | 1.07 | 7.92 | 64.6 | 2251 | 1001 | 314 | 0.007 | |
| 12 | 0.050 | 0.010 | 0.250 | 0.16 | 0.43 | 0.45 | 0.956 | 1.04 | 7.72 | 56.8 | 2654 | 746 | 332 | 0.020 | ※ |
| 13 | 0.050 | 0.030 | 0.150 | 0.22 | 0.35 | 0.44 | 0.795 | 1.01 | 7.53 | 54.8 | 2861 | 565 | 309 | 0.018 | ※ |
| 14 | 0.051 | 0.041 | 0.170 | 0.26 | 0.40 | 0.41 | 0.976 | 1.07 | 8.00 | 60.9 | 2129 | 952 | 307 | 0.010 | |
| 15 | 0.090 | 0.060 | 0.210 | 0.10 | 0.39 | 0.40 | 0.975 | 0.89 | 7.75 | 58.7 | 2867 | 672 | 341 | 0.021 | ※ |
| 16 | 0.120 | 0.090 | 0.150 | 0.22 | 0.41 | 0.37 | 1.108 | 1.00 | 7.65 | 56.2 | 3012 | 578 | 327 | 0.024 | ※ |

※: Comparative Example

The mixed powders obtained were calcinated under the same conditions as in Example 1 and then wet pulverized again with a ball mill.

The powder that had been pulverized was calcinated to form electrodes and polarized by applying a voltage by the same methods as in Example 1. The results of measurement of the piezoelectric characteristics of each of the ceramic materials conducted at least 24 hours after the polarization treatment are given with the results of density calculation in Table 2.

TABLE 2

| Sample No | x | e + f + g | h | i | e + f + g + h + i | Density [g/cm$^3$] | Kp | $\epsilon_r$ | $d_{33}$ | Tc | tan δ | Remarks |
|---|---|---|---|---|---|---|---|---|---|---|---|---|
| 17 | 0.990 | 0.19 | 0.42 | 0.39 | 1.00 | 7.83 | 64.8 | 2276 | 836 | 328 | 0.011 | |
| 18 | 0.990 | 0.22 | 0.44 | 0.34 | 1.00 | 6.72 | 42.7 | 1381 | — | — | — | ※ |
| 19 | 0.990 | 0.22 | 0.40 | 0.38 | 1.00 | 7.76 | 65.8 | 2171 | 738 | 318 | 0.015 | |
| 20 | 0.993 | 0.20 | 0.39 | 0.41 | 1.00 | 7.83 | 64.6 | 2180 | 785 | 323 | 0.010 | |
| 21 | 0.993 | 0.23 | 0.39 | 0.38 | 1.00 | 6.30 | 50.4 | 1354 | — | — | — | ※ |
| 22 | 0.993 | 0.20 | 0.43 | 0.37 | 1.00 | 6.40 | 44.9 | 1587 | — | — | — | ※ |
| 23 | 0.993 | 0.17 | 0.41 | 0.39 | 0.97 | 7.05 | 56.8 | 1634 | 585 | 315 | 0.013 | ※ |
| 24 | 0.993 | 0.20 | 0.42 | 0.38 | 1.00 | 7.76 | 62.8 | 2070 | 719 | 324 | 0.010 | |
| 25 | 0.995 | 0.20 | 0.40 | 0.40 | 1.00 | 7.81 | 65.9 | 1852 | 810 | 320 | 0.007 | |
| 26 | 0.995 | 0.21 | 0.38 | 0.41 | 1.00 | 7.83 | 61.7 | 1859 | 765 | 318 | 0.065 | |
| 27 | 0.995 | 0.22 | 0.42 | 0.38 | 1.02 | 6.20 | 46.7 | 1486 | — | — | — | ※ |
| 28 | 0.997 | 0.20 | 0.40 | 0.40 | 1.00 | 7.87 | 60.4 | 2070 | 786 | 321 | 0.055 | |
| 29 | 0.997 | 0.23 | 0.36 | 0.41 | 1.00 | 5.76 | — | — | — | — | — | ※ |
| 30 | 0.997 | 0.24 | 0.39 | 0.37 | 1.00 | 5.47 | — | — | — | — | — | ※ |
| 31 | 0.997 | 0.19 | 0.40 | 0.41 | 1.00 | 7.66 | 62.3 | 2130 | 733 | 322 | 0.009 | |
| 32 | 0.997 | 0.21 | 0.39 | 0.40 | 1.00 | 7.63 | 61.8 | 1986 | 754 | 321 | 0.010 | |
| 33 | 0.997 | 0.21 | 0.40 | 0.39 | 1.00 | 7.72 | 63.1 | 2446 | 811 | 325 | 0.007 | |

※: Comparative Example

In Table 2, the value of x was fixed at x=0.990 in Samples 17 to 19, x=0.993 in Samples 20 to 24, x=0.995 in Samples 25 to 27, and x=0.997 in Samples 28 to 33, and the values of e+f+g, h, and i were varied. La was employed as M$^3$ in Samples 17 to 32 and K in Sample 33.

Since the values of e+f+g, h, and i were all within the ranges of the ceramic materials of the present invention and the value of e+f+g+h+i was 1 in Samples 17, 19, 20, 24 to 26, 28, 31, and 32, density and Kp were both good. The density values shown in Table 2 indicated that it was desirable to conduct sintering at a calcination temperature of 950° C., and the values of Kp indicated that the ceramic materials of the present invention had good piezoelectric characteristics.

By contrast, in Sample 21, where value e exceeded 0.22, sintering was incomplete, Kp was low, and adequate piezoelectric characteristics were not achieved. Further, although value e exceeded 0.22 in Samples 29 and 30, the density was much lower than in Sample 21 and sintering was poor. From this, it was thought that the amount 0.002 by which value x exceeded Sample 21 reduced the PZT component, resulting in incomplete sintering.

In Samples 29 and 30, since sintering was substantially poorer than in the other samples, Kp and $\epsilon_r$ were not measured.

In Sample 18, value h exceeded 0.43 and sintering progressed to a certain degree. However, Kp was low and good piezoelectric characteristics were not obtained.

In Sample 22, value i was lower than 0.38 and sintering was incomplete. Thus, the Kp value was low and good piezoelectric characteristics were not obtained.

Samples 23 and 27 were prepared as examples where the condition e+f+g+h+i=1 was not satisfied. In Sample 23, e+f+g+h+i<1, and sintering progressed to a certain degree. However the Kp value was low and good piezoelectric characteristics were not achieved. In Sample 27, since e+f+g+h+i>1, sintering was incomplete, Kp was low, and piezoelectric characteristics were inadequate.

K was employed as M$^3$ in Sample 33 and the values of e+f+g, h, and i all fell within the ranges of the present invention. In the same manner as for La, sintering was good and good piezoelectric characteristics were achieved.

In Sample 32, M$^4$ comprised Co and Zn without Ni. Even without incorporating Ni into M$^4$, good sintering and good piezoelectric characteristics were achieved in the same manner as in the other samples. Thus, Ni was found to be an optional element in M$^4$ in the ceramic materials of the present invention.

In the ceramic materials of the present invention, even when the Curie temperature was high, at greater than or equal to 250° C., good piezoelectric characteristics in the form of a low relative dielectric constant and dielectric loss factor were achieved with good longitudinal elongation. Further, it was possible to prepare the ceramic materials of the present invention by sintering at a calcination temperature of less than or equal to 950° C. to achieve a high electromechanical coupling factor and good piezoelectric characteristics in the form of a low relative dielectric constant. Further, since the ceramic materials of the present invention could be calcinated at less than or equal to 950° C., there was a significant reduction in cost due to a shorter manufacturing time and reduction in the equipment and power required.

Further, the piezoelectric element employing the ceramic materials of the present invention has good piezoelectric characteristics and can be manufactured at low cost. Specifically, since the present invention can be sintered at a temperature of less than or equal to 950° C. when it is a laminated piezoelectric element, not only can inexpensive metals and noble metals such as copper be employed as the internal electrode, but silver-palladium alloys with low palladium composition ratios such as Ag95-5% Pd can be employed. Thus, the laminate piezoelectric element of the present invention is useful as a laminate piezoelectric actuator.

INDUSTRIAL APPLICABILITY

Since the ceramic materials of the present invention afford the advantages of permitting the obtaining of small elements with desired elongation and generates little heat during use, it is highly suited to applications such as piezoelectric elements such as piezoelectric actuators, particularly laminate piezoelectric elements and laminate piezoelectric transducer elements.

The invention claimed is:

1. A ceramic material comprised of Pb, Zr, and Ti denoted by general formula
    $ABO_d$, wherein
    A incorporates Pb and is denoted by $Pb_{1-a}M^1{}_{a-b}$, where $M^1$ is selected from the group consisting of group 3A elements, Li, Na, K, Mg, Ca, and Sr, $0<a<0.08$, and $0<b<0.075$,
    B incorporates Zr and Ti, and
    d is the total number of oxygen atoms in oxide A and oxide B.

2. The ceramic material of claim 1, wherein $M^1$ is one or more elements selected from the group consisting of Sc, Y, La, Ce, Pr, Nd, Pm, Sm, Eu, Gd, Tb, Dy, Ho, Er, Tm, K, and Lu.

3. The ceramic material of claim 2, wherein $M^1$ is one or more elements selected from the group consisting of La and K.

4. The ceramic material of claim 1, wherein the piezoelectric strain constant $d_{33}$ in the longitudinal direction is greater than or equal to 850.

5. The ceramic material of claim 1, wherein the dielectric loss factor tan δ satisfies the relation of $0.003<\tan \delta<0.012$.

6. The ceramic material of claim 1, wherein the Curie temperature Tc is greater than 250° C. and the relative dielectric constant $\epsilon_r$ is less than 2,300.

7. A ceramic material comprised of Pb, Zr, and Ti denoted by general formula
    $ABO_d$, wherein
    A incorporates Pb,
    B incorporates Zr and Ti and is denoted by $(M^2{}_{1/3}Nb_{2/3-c})_\alpha Zr_\beta Ti_\gamma$, where $M^2$ is one or more elements capable of forming at least a perovskite structure in the ceramic material, $0.05<c<0.2$, $0.18<\alpha<0.28$, $0.36<\beta<0.44$, and $0.36<\gamma<0.44$), and
    d is the total number of oxygen atoms in oxide A and oxide B.

8. The ceramic material of claim 7, wherein $M^2$ is three or more elements selected from the group consisting of Ni, Zn, Co, Mn, and Mg.

9. The ceramic material of claim 8, wherein $M^2$ is Ni, Zn, and Co.

10. The ceramic material of claim 7, wherein β and γ satisfy the relation of $0.92<\beta/\gamma<1.08$.

11. The ceramic material of claim 7, wherein α, β, and γ satisfy the relation of $0\leq\alpha+\beta+\gamma\leq1.15$.

12. The ceramic material of claim 7, wherein the piezoelectric strain constant $d_{33}$ in the longitudinal direction is greater than or equal to 850.

13. The ceramic material of claim 7, wherein the dielectric loss factor tan δ satisfies the relation of $0.003<\tan \delta<0.012$.

14. The ceramic material of claim 7, wherein the Curie temperature Tc is greater than 250° C. and the relative dielectric constant $\epsilon_r$ is less than 2,300.

15. A ceramic material denoted by formula (1) below:

$$Pb_{1-a}M^1{}_{a-b}[(M^2{}_{1/3}Nb_{2/3-c})_\alpha Zr_\beta Ti_\gamma]O_d \qquad (1),$$

wherein
    $M^1$ is one or more elements selected from the group consisting of group 3A elements, Li, Na, K, Mg, Ca, and Sr,
    $M^2$ is three or more elements selected from the group consisting of Mg, Ca, Sr, Cr, Mn, Fe, Co, Ni, and Zn, $0<a<0.08$, $0<b<0.075$, $0.05<c<0.2$, $0.18<\alpha<0.28$, $0.36<\beta<0.44$, and $0.36<\gamma<0.44$; and
    d is the sum of the number of oxygen atoms contained in the oxides of Pb, $M^1$, $M^2$, Nb, Zr, and Ti.

16. The ceramic material of claim 15, wherein $M^1$ is one or more elements selected from the group consisting of Sc, Y, La, Ce, Pr, Nd, Pm, Sm, Eu, Gd, Tb, Dy, Ho, Er, Tm, K, and Lu.

17. The ceramic material of claim 16, wherein $M^1$ is one or more elements selected from the group consisting of La and K.

18. The ceramic material of claim 15, wherein $M^2$ is three or more elements selected from the group consisting of Ni, Zn, Co, Mn, and Mg.

19. The ceramic material of claim 18, wherein $M^2$ is Ni, Zn, and Co.

20. The ceramic material of claim 15, wherein β and γ satisfy the relation of $0.92<\beta/\gamma<1.08$.

21. The ceramic material of claim 15, wherein α, β, and γ satisfy the relation of $0\leq\alpha+\beta+\gamma\leq1.15$.

22. The ceramic material of claim 15, wherein the piezoelectric strain constant $d_{33}$ in the longitudinal direction is greater than or equal to 850.

23. The ceramic material of claim 15, wherein the dielectric loss factor tan δ satisfies the relation of $0.003<\tan \delta<0.012$.

24. The ceramic material of claim 15, wherein the Curie temperature Tc is greater than 250° C. and the relative dielectric constant $\epsilon_r$ is less than 2,300.

25. A ceramic material comprising Pb, Zr, and Ti, denoted by general formula
    $ABO_d$, wherein
    A incorporates a Pb oxide and a $M^1$ oxide and is denoted by $Pb_{1-a}M^1{}_{a-b}$, where $M^1$ is selected from the group consisting of group 3A elements, Li, Na, K, Mg, Ca, and Sr, $0<a<0.08$, and $0<b<0.075$,
    B incorporates a Zr oxide and a Ti oxide, and
    d is the total number of oxygen atoms in oxide A and oxide B, and having piezoelectric strain constant $d_{33}$ in the longitudinal direction greater than or equal to 850, a dielectric loss factor tan δ satisfying the relation $0.003<\tan \delta<0.012$, a Curie temperature Tc greater than 250° C., and a relative dielectric constant $\epsilon_r$, less than 2,300.

26. The ceramic material of claim 25, wherein the ceramic material further comprises one or more elements selected from the group consisting of elements of groups 1A to 2B in the IV$^{th}$ period, elements of groups 1A to 3A and 6A in the V$^{th}$ period, and elements of groups 1A to 6A in the VI$^{th}$ period.

27. The ceramic material of claim 25, wherein the ceramic material further comprises one or more elements selected from the group consisting of Sc, Y, La, Ce, Pr, Nd, Pm, Sm, Eu, Gd, Tb, Dy, Ho, Er, Tm, K, Lu, Ni, Zn, Co, Mn, and Mg.

28. A ceramic material denoted by general formula (2) below:

$$Pb_xM^3{}_{1-x}[(M^4{}_{1/3}Nb_{2/3})_e(Co_{1/3}Nb_{2/3})_f(Zn_{1/3}Nb_{2/3})_g Zr_hTi_i]O_3 \qquad (2)$$

where, in Fomula (2), $M^3$ denotes one or more elements selected from the group consisting of La, K, Er, and Yb; $M^4$ denotes an element selected from the group consisting of Ni, Mn, and Sr; $0.990\leq x\leq 0.997$; $0\leq e\leq 0.22$; $0<f<0.22$; $0<g<0.22$; $0.38\leq h\leq 0.43$; $0.38\leq i\leq 0.41$; $0.18\leq e+f+g\leq 0.22$; and $e+f+g+h+i=1$.

29. The ceramic material of claim 28, wherein $M^3$ is K or La.

30. The ceramic material of claim 28, wherein $M^4$ is Ni.

31. The ceramic material of claim 28, wherein the density of the ceramic material is greater than or equal to 7.6 g/cm$^3$.

32. A piezoelectric element comprising the ceramic material of claim 1 and at least one pair of electrodes.

33. A laminated piezoelectric element comprising a structural member in which the ceramic material of claim 1 and electrodes are alternately laminated.

34. The laminated piezoelectric element of claim 33, wherein the electrode comprises Cu, Ag, a Ag—Pt alloy, or a Ag—Pd alloy.

35. A piezoelectric element comprising the ceramic material of claim 7 and at least one pair of electrodes.

36. A laminated piezoelectric element comprising a structural member in which the ceramic material of claim 7 and electrodes are alternately laminated.

37. The laminated piezoelectric element of claim 36, wherein the electrode comprises Cu, Ag, a Ag—Pt alloy, or a Ag—Pd alloy.

38. A piezoelectric element comprising the ceramic material of claim 15 and at least one pair of electrodes.

39. A laminated piezoelectric element comprising a structural member in which the ceramic material of claim 15 and electrodes are alternately laminated.

40. The laminated piezoelectric element of claim 39, wherein the electrode comprises Cu, Ag, a Ag—Pt alloy, or a Ag—Pd alloy.

41. A piezoelectric element comprising the ceramic material of claim 25 and at least one pair of electrodes.

42. A laminated piezoelectric element comprising a structural member in which the ceramic material of claim 25 and electrodes are alternately laminated.

43. The laminated piezoelectric element of claim 42, wherein the electrode comprises Cu, Ag, a Ag—Pt alloy, or a Ag—Pd alloy.

44. A piezoelectric element comprising the ceramic material of claim 28 and at least one pair of electrodes.

45. A laminated piezoelectric element comprising a structural member in which the ceramic material of claim 28 and electrodes are alternately laminated.

46. The laminated piezoelectric element of claim 45, wherein the electrode comprises Cu, Ag, a Ag—Pt alloy, or a Ag—Pd alloy.

* * * * *